United States Patent [19]

Kato

[11] Patent Number: 5,373,260

[45] Date of Patent: Dec. 13, 1994

[54] PLURAL SAW OSCILLATORS PRODUCING COMBINED HIGH FREQUENCY OUTPUT

[75] Inventor: Akira Kato, Nagaokakyo, Japan

[73] Assignee: Murata Manufacturing Co., Ltd., Kyoto, Japan

[21] Appl. No.: 161,114

[22] Filed: Dec. 2, 1993

[30] Foreign Application Priority Data

Dec. 2, 1992 [JP] Japan .................................. 4-350281

[51] Int. Cl.⁵ .............................................. H03B 5/36
[52] U.S. Cl. ........................................ 331/45; 331/56; 331/76; 331/107 A
[58] Field of Search ................. 331/107 A, 53, 56, 46, 331/76, 45

[56] References Cited

U.S. PATENT DOCUMENTS 5,016,260  5/1991  Masuda .................. 331/107 A X
5,180,994  1/1993  Martin et al. ............. 331/45 X Primary Examiner—Siegfried H. Grimm
Attorney, Agent, or Firm—Heller, Ehrman, White & McAuliffe

[57] ABSTRACT

A surface acoustic wave resonator has a plural number N of interdigital transducers arranged in a sequence on a piezoelectric substrate to generate N surface acoustic wave signals with a predetermined frequency $f_0$ and having phase difference of $2\pi/N$ radian therebetween. Oscillation circuits are individually connected to the N interdigital transducers and generate N oscillation signals with the same frequency $f_0$ and having phase difference of $2\pi/N$ radian therebetween. These oscillation signals are multiplied together to generate a signal with frequency N times the predetermined frequency $f_0$.

5 Claims, 2 Drawing Sheets

PLURAL SAW OSCILLATORS PRODUCING COMBINED HIGH FREQUENCY OUTPUT

BACKGROUND OF THE INVENTION

1. Field of the Invention

This invention relates to a surface acoustic wave oscillator, and more particularly to an oscillator by which a higher-frequency signal can be obtained from an original signal by increasing the original frequency by a factor of N which is an integer greater than 1.

2. Description of the Prior Art

For obtaining a high-frequency signal, it has been known to use a surface acoustic wave (SAW) oscillator comprising a SAW resonator and an oscillator capable of generating a predetermined frequency in association with interdigital transducers (hereinafter referred to as IDT) of the SAW resonator. A signal of a desired high frequency can thus be obtained. Since the resonant frequency of the SAW resonator is determined, for example, by the line width of the IDT, the frequency which can lead to a resonance is restricted within the processing limit of the SAW resonator. Thus, if the SAW oscillator is comprised of a SAW resonator and an oscillator, the oscillating frequency can be at most about 1 GHz. If a signal with frequency higher than 1 GHz is desired, a frequency multiplier was used conventionally to obtain such a high-frequency signal.

Although it is possible to obtain desired high-frequency signals through frequency multiplication of an original signal by means of a frequency multiplier, the output from a multiplier includes many higher harmonics, and unwanted higher harmonics must be removed in order to obtain a signal with only the desired frequency. This, however, requires the use of expensive additional components such as band pass filters.

SUMMARY OF THE INVENTION

It is therefore an object of the invention to provide a SAW oscillator capable of providing a signal of small spurious emissions and with a desired high frequency.

It is another object of the invention to provide such an oscillator without requiring expensive additional components such as band filters.

A surface acoustic wave oscillator embodying the present invention, with which the above and other objects can be achieved, may be characterized as comprising a surface acoustic wave resonator, a plural number N of oscillators and operator means. The surface acoustic wave resonator includes a piezoelectric substrate, grating reflectors formed thereon, and N interdigital transducers arranged in a sequence on the piezoelectric substrate for generating N SAW signals with a predetermined frequency of $f_0$ and having a phase difference given by $2\pi/N$ between each mutually adjacent pair in the sequence. The N oscillators are each connected to a different one of the N interdigital transducers for producing N oscillation signals with the same frequency $f_0$ and having a phase difference of $2\pi/N$ between pairs of them. The operator means is for multiplying these N oscillation signals together and thereby producing a signal with frequency equal to N times $f_0$. Throughout herein, phase differences will be in units of radian.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

In these figures, like components are indicated by like numerals.

DETAILED DESCRIPTION OF THE INVENTION

Figure 1:
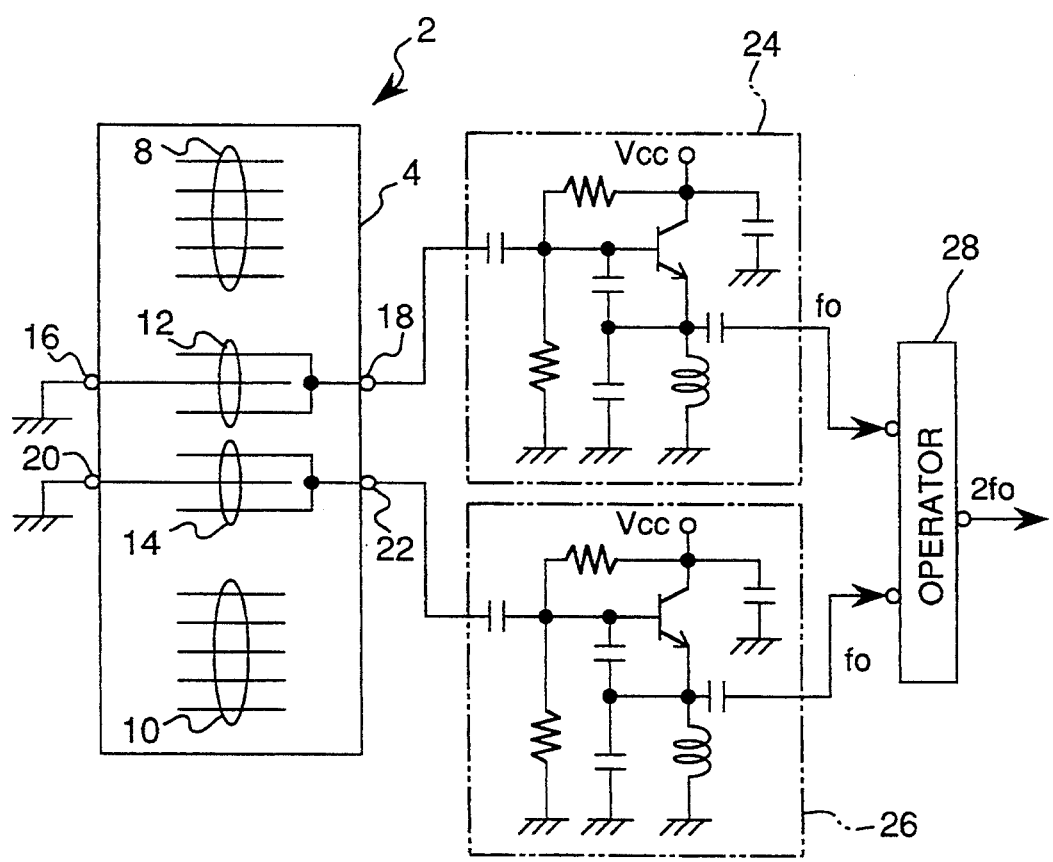
FIG. 1 is a circuit diagram of a dielectric SAW oscillator according to a preferred embodiment of the invention.

As shown in FIG. 1, a dielectric SAW (surface acoustic wave) oscillator according to a first embodiment of the invention, capable of outputting a signal with twice the frequency generated by a SAW resonator 2, comprises two grating reflectors 8 and 10 and two IDTs (interdigital transducers) 12 and 14 formed on a piezoelectric substrate 4 of the SAW resonator 2. A resonant cavity is acoustically defined between the grating reflectors 8 and 10, in which SAW standing waves are generated such that a piezoelectric vibration can be caused if the IDTs 12 and 14 are properly positioned relative to the cavity for coupling with these standing waves. If the resonance signal of the SAW resonator 2 has a center frequency of $f_0$, wavelength of $\lambda_0$, and propagation velocity of $V_{SAW}$, they are related by $\lambda_0 = V_{SAW}/f_0$. A phase difference of $2\pi$ exists between any two points spaced apart by one wavelength $\lambda_0$. In other words, if the IDTs 12 and 14 are spaced apart by one wavelength, they are in the same phase. According to the first embodiment of the invention, however, the IDTs 12 and 14 are spaced apart from each other by $(M+\frac{1}{2})\lambda_0$ where M is 0 or a positive integer such that signals received thereby have a phase difference of $\pi$.

The IDT 12 is provided with terminals 16 and 18, and the other IDT 14 is provided with terminals 20 and 22. The terminals 16 and 20 of the SAW resonator 2 are grounded, the terminal 18 is connected to a circuit 24 and the terminal 22 is connected to another circuit 26. The IDT 12 and the circuit 24 together form a Colpitts oscillator circuit oscillating at a frequency $f_0$. Similarly, the IDT 14 and the circuit 26 together form another Colpitts oscillator circuit oscillating at the same frequency $f_0$. The two IDTs 12 and 14 produce signals with a phase difference of $\pi$ therebetween because of their positions with respect to each other. Thus, the outputs from the two circuits 24 and 26 have the same frequency $f_0$, but the standing waves picked up by the IDTs 12 and 14 have a phase difference of $\pi$ therebetween. Let the output voltage from the circuit 24 be expressed as $v_0\sin\omega t$. Then, the output from the other circuit 26 can be expressed as $v_0\sin(-\omega t)$ because of the phase difference of $\pi$ therebetween. These two signals outputted from the two circuits 24 and 26 are sent to an operator 28 which may comprise a multiplier which multiplies the aforementioned signals $v_0\sin\omega t$ and $v_0\sin(-\omega t)$ respectively from the circuits 24 and 26 to produce a product signal as follows:

$$|v_0\sin\omega t \times v_0\sin(-\omega t)| = v_0^2 \sin^2\omega t$$
$$= v_0^2(1 - \cos 2\omega t)/2.$$

This shows that the resulting product signal thus obtained has a frequency $2f_0$ which is twice the frequency $f_0$ of the signals from the SAW resonator 2. In other words, the operator 28 serves to produce a signal having only the twice-as-large frequency $2f_0$ without introducing any higher harmonics and with only small spurious emissions.

As another advantage of the present invention, the low phase noises and low shock noises may be turned effective at high frequencies by the SAW resonator 2 and the circuits 24 and 26. It is also easy to balance the oscillating frequency because the two circuits 24 and 26 are identical in structure. Furthermore, the SAW resonator 2 is required for use only at the frequency $f_0$, and the transistors in the circuits 24 and 26 are required only for use for the cutoff frequency $f_0$. In other words, they are not intended to be used at high frequencies up to $2f_0$. As a result, the SAW oscillator according to this embodiment of the invention can be manufactured inexpensively.

Figure 2:
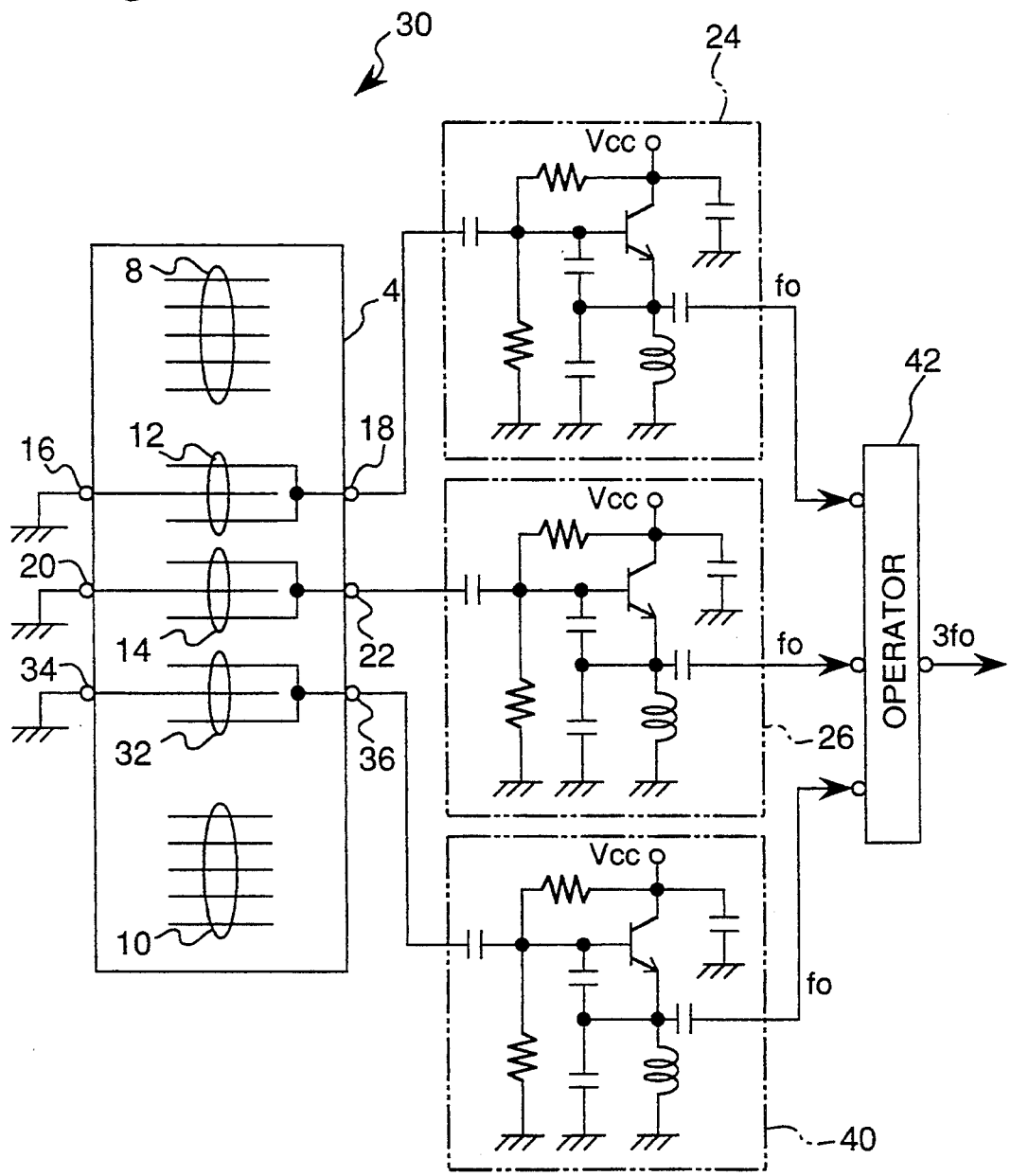
FIG. 2 is a circuit diagram of a dielectric SAW oscillator according to another embodiment of the invention.

FIG. 2 shows a dielectric SAW oscillator 30 according to a second embodiment of the invention, adapted to output a signal with a frequency three times as large as the original frequency of the signal from a SAW resonator 30. Components which are at least equivalent to those described above with reference to FIG. 1 are indicated by the same reference numerals for convenience.

As shown in FIG. 2, the SAW resonator 30 according to this embodiment has three IDTs 12, 14 and 32 on the piezoelectric substrate 4, the IDT 14 being arranged between the IDTs 12 and 32. The IDTs 12 and 14 are spaced apart from each other such that the signals received thereby have a phase difference of $2\pi/3$ therebetween, that is, they are spaced away from each other by a distance given by $(M+\frac{1}{3})\lambda_0$ where M is 0 or a positive integer. The IDTs 14 and 32 are similarly spaced apart from each other such that the signals received thereby have a phase difference of $2\pi/3$ therebetween, that is, they are spaced away from each other by a distance given by $(P+\frac{1}{3})\lambda_0$ where P is also 0 or a positive integer, preferably equal to M.

The IDT 32 has a grounded terminal 34 and another terminal 36 which is connected to a third circuit 40 structured similarly to the other two circuits 24 and 26. The IDT 32 and the circuit 40 together form a Colpitts oscillator circuit oscillating with the frequency $f_0$.

The outputs from the three circuits 24, 26 and 40 all have the same frequency $f_0$. Since the three IDTs 12, 14 and 32 are spaced apart from one another in the way described above, however, the outputs therefrom have a phase difference of $2\pi/3$. If the output voltage from the circuit 26 is expressed as $v_0\sin\omega t$, the output voltages from the circuits 24 and 32 can be expressed respectively as $v_0\sin(\omega t - 2\pi/3)$ and $v_0\sin(\omega t + 2\pi/3)$.

The signals generated from the circuits 24, 26 and 40 are fed to an operator 42, which may, for example, be comprised of mixers similar to the operator 28 shown in FIG. 1 such that the signals from the three circuits 24, 26 and 40 are multiplied therein and a signal having frequency $3f_0$ is produced as follows:

$v_0\sin(\omega t - \frac{2}{3}\pi) \times v_0\sin\omega t \times v_0\sin(\omega t + \frac{2}{3}\pi) =$ $v_0^3 \cdot \{(\sin\omega t \cdot \cos\frac{2}{3}\pi) - (\cos\omega t \cdot \sin\frac{2}{3}\pi)\} \times \sin\omega t \times$ $\{(\sin\omega t \cdot \cos\frac{2}{3}\pi) + (\cos\omega t \cdot \sin\frac{2}{3}\pi)\} =$ $v_0^3 \cdot (\frac{1}{4}\sin^2\omega t - \frac{3}{4}\cos^2\omega t) \cdot \sin\omega t =$ $v_0^3 \cdot (\frac{1}{4}\sin^3\omega t - \frac{3}{4}\sin\omega t \cdot \cos^2\omega t) =$ -continued $v_0^3 \cdot \{\frac{1}{4}\sin^3\omega t - \frac{3}{4}\sin\omega t \cdot (1 - \sin^2\omega t)\} =$ $v_0^3 \cdot (\frac{1}{4}\sin^3\omega t - \frac{3}{4}\sin\omega t + \frac{3}{4}\sin^3\omega t) =$ $v_0^3 \cdot (4\sin^3\omega t - 3\sin\omega t)/4.$ Since $\sin3\omega t = (3\sin\omega t - \sin3\omega t)$, the above can be written as follows:

$|v_0^3 \cdot (4\sin^3\omega t - 3\sin\omega t)/4| =$ $v_0^3 \cdot (3\sin\omega t - \sin3\omega t - 3\sin\omega t)/4 = \frac{1}{4} \cdot v_0^3 \cdot \sin3\omega t.$ In summary, the operator 42 outputs a signal with frequency equal to three times the original frequency $f_0$.

Since the only function of the operator 42 is to carry out multiplication, it does not generate any higher harmonics. Thus, it is possible according to this invention to obtain outputs with frequency $3f_0$ with only small spurious emissions. Moreover, since both the SAW resonator 30 and the transistors of the circuits 24, 26 and 40 are intended to function only at frequency $f_0$, no expensive parts for high frequencies are required. Thus, the SAW oscillator according to the present invention can be formed at a reduced cost.

Although the present invention has been described above only for obtaining signals with twice and thrice the original frequency, the invention is not limited to these examples. In general, it is possible according to the present invention to obtain a signal with frequency equal to N times the original frequency by arranging N IDTs where N is a positive integer which can be 4 or greater. In such an application, N IDTs are arranged sequentially such that the phase difference between signals produced by each mutually adjacent pair of the IDTs is $2\pi/N$ and N such signals having the same frequency are multiplied together.

Although it was stated above that Colpitts oscillator circuits are formed by the IDTs 12, 14 and 32 and the circuits 24, 26 and 40 to achieve the desired oscillations, Pierce model oscillators or Hartley oscillators may be employed instead.

In summary, a SAW oscillator according to the present invention is provided with a SAW resonator having a plural number N of interdigital transducers which are arranged on a piezoelectric substrate such that signals of a predetermined frequency can be thereby generated with phase difference of $2\pi/N$ between pairs of these signals, and an operator serves to multiply together these N signals from the interdigital transducers so as to thereby produce a signal having frequency N times the original frequency. With a SAW oscillator thus structured, high frequency signals with small spurious emissions can be obtained at low costs without using expensive component parts such as band pass filters.

Although the invention has been described by way of only a few examples, they are intended to be illustrative. Many modifications and variations can be made within the spirit of the invention. Such modifications and variations that may be apparent to a person skilled in the art are intended to be within the scope of the invention.

What is claimed is:

1. A surface acoustic wave oscillator comprising:
  a surface acoustic wave resonator which includes:
    a piezoelectric substrate;
    grating reflectors formed on said piezoelectric substrate; and N interdigital transducers arranged between said grating reflectors on said piezoelectric substrate for generating N surface acoustic wave signals with a predetermined frequency and having phase difference of $2\pi/N$ radian therebetween, N being an integer greater than one;

N oscillators connected individually to said N interdigital transducers for producing N oscillation signals with said predetermined frequency and having phase difference of $2\pi/N$ radian therebetween; and operator means for multiplying said N oscillation signals together and thereby producing a signal having a frequency equal to N times said predetermined frequency.

2. The surface acoustic wave oscillator of claim 1 wherein said N interdigital transducers are arranged in a sequence, each mutually adjacent pair of said N interdigital transducers being separated by $(M+\frac{1}{2})\lambda_0$ where M is 0 or a positive integer and $\lambda_0$ is the wavelength of said surface acoustic wave signals.

3. The surface acoustic wave oscillator of claim 1 wherein said N is two.

4. The surface acoustic wave oscillator of claim 1 wherein said N is three.

5. The surface acoustic wave oscillator of claim 1 wherein each of said N oscillators is a Colpitts oscillator.

* * * * *